mura et al.

(12) United States Patent
Shimomura et al.

(10) Patent No.: US 11,280,020 B2
(45) Date of Patent: Mar. 22, 2022

(54) SUBSTRATE HOLDER AND PLATING DEVICE

(71) Applicant: EBARA CORPORATION, Tokyo (JP)

(72) Inventors: Naoki Shimomura, Tokyo (JP); Mizuki Nagai, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 74 days.

(21) Appl. No.: 16/920,452

(22) Filed: Jul. 3, 2020

(65) Prior Publication Data

US 2021/0054521 A1 Feb. 25, 2021

(30) Foreign Application Priority Data

Aug. 22, 2019 (JP) .............................. JP2019-151825

(51) Int. Cl.
*C25D 17/08* (2006.01)
*C25D 17/00* (2006.01)
*H01L 21/687* (2006.01)
*C25D 7/12* (2006.01)

(52) U.S. Cl.
CPC .......... *C25D 17/08* (2013.01); *C25D 17/007* (2013.01); *C25D 17/008* (2013.01); *H01L 21/68721* (2013.01); *C25D 7/12* (2013.01)

(58) Field of Classification Search
None
See application file for complete search history.

(56) References Cited

U.S. PATENT DOCUMENTS

| 2016/0194780 A1* | 7/2016 | Nagai | H01L 21/2885 |
| | | | 204/242 |
| 2017/0058423 A1* | 3/2017 | Mine | H01L 24/11 |

FOREIGN PATENT DOCUMENTS

| JP | 2016079504 | 5/2016 |
| JP | 2019007075 | 1/2019 |

\* cited by examiner

*Primary Examiner* — Louis J Rufo
(74) *Attorney, Agent, or Firm* — JCIPRNET

(57) ABSTRACT

According to an embodiment, a substrate holder holds a rectangular substrate and performs electrolytic plating on the substrate. The substrate holder includes a first holding member and a second holding member clamping the substrate between the first holding member and it and having a contact which contacts a peripheral part of the substrate and supplies an electric current to the substrate. The second holding member includes an opening defining a region where an electric field is formed and, at a position farther from the substrate than the opening, a shielding part protruding closer to an inner side than the opening and shielding the peripheral part of a surface of the substrate. The shielding part has a frame shape having a predetermined shielding width in the peripheral part of the substrate, and has, at a corner part thereof, a discontinuous part having a smaller shielding width than surroundings.

6 Claims, 14 Drawing Sheets

SUBSTRATE HOLDER AND PLATING DEVICE

CROSS-REFERENCE TO RELATED APPLICATION

This application claims the priority benefit of Japan application serial no. 2019-151825, filed on Aug. 22, 2019. The entirety of the above-mentioned patent application is hereby incorporated by reference herein and made a part of this specification.

BACKGROUND

Technical Field

The disclosure relates to a substrate holder and a plating device.

Description of Related Art

For a method for forming wirings and bumps (protruding electrodes) on a substrate such as a semiconductor wafer, an electrolytic plating method which is relatively inexpensive and has a short processing time is widely used. The plating device used for the electrolytic plating method includes a substrate holder that seals an end surface of the substrate and exposes and holds a surface to be plated. The substrate is plated by being immersed in a plating solution together with the substrate holder.

During the plating process, a conductive material is deposited on the surface of the substrate by passing an electric current between the substrate and the anode immersed in the plating solution. The substrate is connected to a power supply via the substrate holder, and the anode is connected to the power supply via an anode holder. Generally, electrical contacts for passing an electric current through the substrate are located at a peripheral part of the substrate. Therefore, a central part of the substrate and the peripheral part of the substrate have different distances from the electric contacts, and a potential difference occurs between the central part of the substrate and the peripheral part of the substrate by the electric resistance of a seed layer. Therefore, the plating layer is thin in the central part of the substrate, and the plating layer is thick in the peripheral part of the substrate. This phenomenon is called the "terminal effect."

The uniformity of the thickness of the plated film on the substrate surface is called "in-plane uniformity." Conventionally, the electric field formed between the anode and the substrate has been controlled in order to alleviate the influence of the terminal effect and to obtain a substrate with high in-plane uniformity. For example, a substrate holder (Patent Document 1) provided with a shielding that shields an electric field from the peripheral part of the substrate is disclosed.

RELATED ART

Patent Document

[Patent Document 1] Japanese Laid-open No. 2016-79504

SUMMARY

Technical Problem

In recent years, there is an increasing demand for a plating process for a large square or rectangular substrate. However, if the electric field is shielded over the entire periphery of the peripheral part of the rectangular substrate, the film thickness may be reduced more than necessary because the corners of the substrate are influenced by the shielding of the electric field on the two sides forming the corner. As a result, the in-plane uniformity of the substrate may be reduced.

The disclosure has been made in view of such circumstances, and the disclosure improves the in-plane uniformity of a rectangular substrate to be plated.

Solution to the Problem

According to an aspect of the disclosure, a substrate holder is provided. The substrate holder is for holding a substrate in a rectangular shape and performing electrolytic plating on the substrate. The substrate holder includes a first holding member and a second holding member having a contact which contacts a peripheral part of the substrate and supplies an electric current to the substrate, wherein the substrate is clamped between the first holding member and the second holding member. The second holding member includes an opening which defines a region where an electric field is formed and, at a position farther from the substrate than the opening, a shielding part which protrudes closer to an inner side than the opening and shields the peripheral part of a surface of the substrate. The shielding part has a frame shape which has a predetermined shielding width in the peripheral part of the substrate, and the shielding part has, at a corner part of the shielding part, a discontinuous part which has a smaller shielding width than surroundings.

According to another aspect of the disclosure, a plating device is provided. The plating device is for performing a plating process on a substrate in a rectangular shape. The plating device includes: a plating tank; an anode disposed in the plating tank; a substrate holder which holds the substrate and which is disposed in the plating tank to face the anode; and a regulation plate which is disposed between the anode and the substrate holder in the plating tank, has an opening in a rectangular shape for adjusting an electric field formed between the anode and the substrate, and has a corner mask protruding toward an inner side at a corner part of the opening. The substrate holder includes a first holding member and a second holding member having a contact which contacts a peripheral part of the substrate and supplies an electric current to the substrate, wherein the substrate is clamped between the first holding member and the second holding member. The second holding member includes an opening which defines a region where the electric field is formed and, at a position farther from the substrate than the opening, a shielding part which protrudes closer to the inner side than the opening and shields the peripheral part of a surface of the substrate. The shielding part has a frame shape which has a predetermined shielding width in the peripheral part of the substrate, and the shielding part has, at a corner part of the shielding part, a discontinuous part which has a smaller shielding width than surroundings.

Effects

According to the disclosure, it is possible to improve the in-plane uniformity of a rectangular substrate to be plated.

DESCRIPTION OF THE EMBODIMENTS

Figure 1:
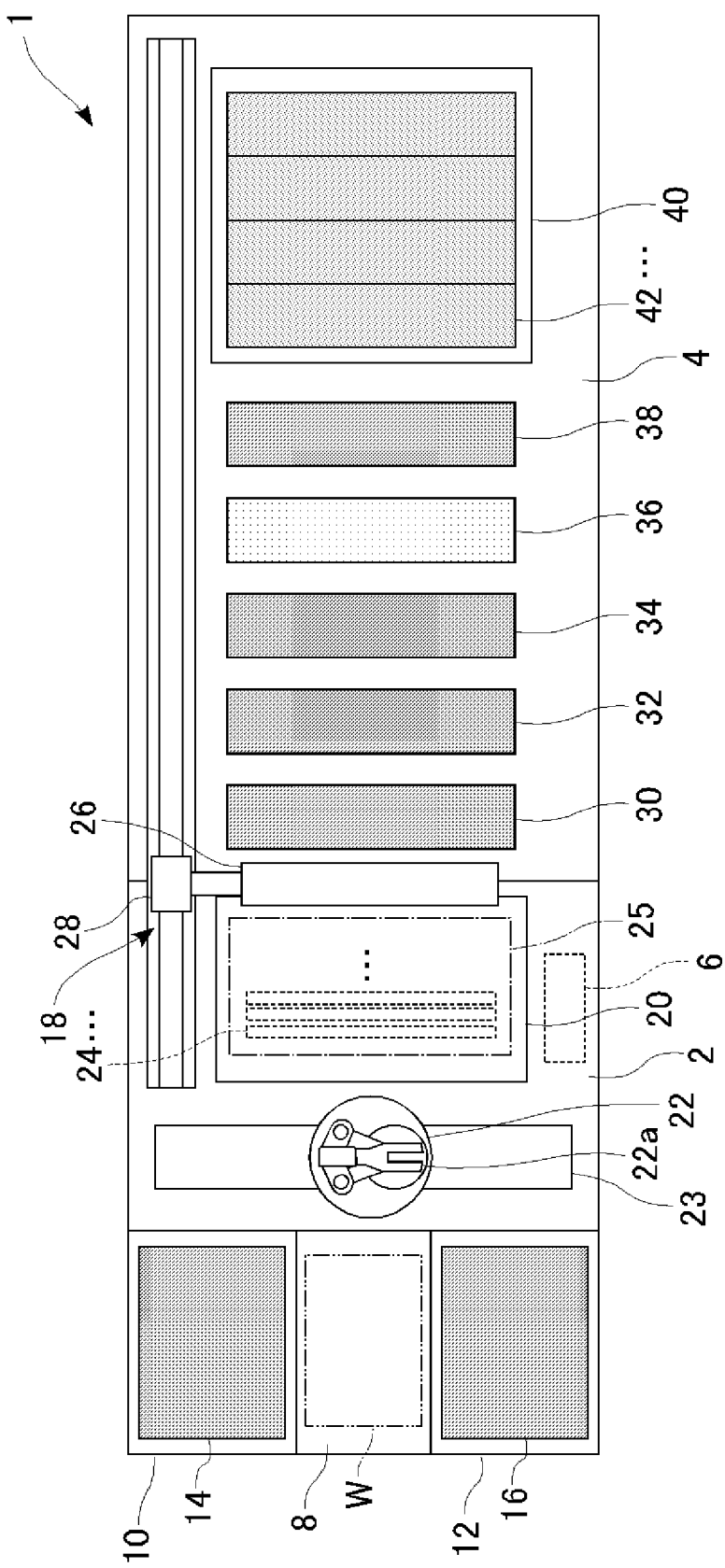
FIG. 1 is a plan view schematically showing a plating device according to a first embodiment.

Hereinafter, embodiments of the disclosure will be described with reference to the drawings. Further, in the following embodiments and modified examples thereof, substantially the same components are denoted by the same reference numerals, and description thereof is appropriately omitted.

First Embodiment

FIG. 1 is a plan view schematically showing a plating device 1 according to a first embodiment.

The plating device 1 includes a substrate attaching and detaching part 2, a plating processing part 4, and a control part 6. The plating device 1 of the embodiment is a bump plating device for forming protruding electrodes (bumps) on a substrate. A substrate delivery table 8 is provided in front of the substrate attaching and detaching part 2, and a pre-cleaning part 10 and a post-cleaning part 12 are provided adjacent to the substrate delivery table 8. Further, a device for delivering the substrate processed in the upstream process to the substrate delivery table 8 is provided in front of the plating device 1, but the description thereof is omitted.

The substrate delivery table 8 mounts a substrate W such as a semiconductor wafer in a horizontal posture. The substrate W is a relatively large, thin substrate and is easily bent. In this embodiment, a rectangular substrate having a side length of about 500 mm is used as the substrate W. The substrate W is one in which a copper seed layer is provided on the upper surface of the wafer, and a resist pattern is formed thereon.

The pre-cleaning part 10 has a cleaning device 14 and performs pre-cleaning to remove organic substances and the like adhering to the surface of the substrate W prior to the plating process. The post-cleaning part 12 has a cleaning device 16 and cleans the substrate W removed from the substrate holder 24 after the plating process. A holder transfer mechanism 18 is provided from the substrate attaching and detaching part 2 to the plating processing part 4. The control part 6 controls the operation of each part.

The substrate attaching and detaching part 2 includes an attaching and detaching mechanism 20, a substrate transfer robot 22, and a movement mechanism 23. The substrate transfer robot 22 has a robot hand 22a. The substrate transfer robot 22 functions as a "substrate transfer part" and delivers the substrate W to and from the substrate delivery table 8 and to and from each mechanism. The robot hand 22a has a non-contact chuck for holding the substrate W in a horizontal posture as it is.

The moving mechanism 23 moves the substrate transfer robot 22 according to a delivery position of the substrate W. The substrate transfer robot 22 moves to the vicinity of the pre-cleaning part 10 in the pre-cleaning process, and moves to the vicinity of the post-cleaning part 12 in the post-cleaning process.

Below the attaching and detaching mechanism 20, a stocker 25 for housing the substrate holder 24 is provided. The attaching and detaching mechanism 20 attaches the substrate W to and detaches the substrate W from the substrate holder 24. The holder transfer mechanism 18 has a holding mechanism 26 that holds the substrate holder 24, and a transfer mechanism 28 that transfers the substrate holder 24 to each tank of the plating processing part 4. The attaching and detaching mechanism 20 also attaches the substrate holder 24 to and detaches the substrate holder 24 from the holding mechanism 26.

The plating processing part 4 has a pre-wet tank 30, a pre-soak tank 32, a rinse tank 34, a blow tank 36, a rinse tank 38, and an overflow tank 40 in this order from the substrate attaching and detaching part 2 side. Plural rows of plating tanks 42 are provided inside the overflow tank 40. The pre-wet tank 30 may fill a resist opening on a surface of the substrate with degassed water by immersing and wetting the substrate W in degassed water. The pre-soak tank 32 etches away an oxide film formed on a surface of the substrate W with a chemical solution.

The rinse tanks 34 and 38 clean the surfaces of the substrate W with deionized water. The rinse tank 34 performs water washing before the plating process, and the rinse tank 38 performs water washing after the plating process. The blow tank 36 dries the substrate W after cleaning. A plating solution is stored in the plating tank 42. The plating may be performed by immersing the substrate W in the plating tank 42 and circulating the plating solution while overflowing the plating solution into the overflow tank 40. The plating process generally has a longer processing time than cleaning, drying or other processes. For this reason, a plurality of plating tanks 42 are provided so that a plurality of substrates W may be simultaneously plated in parallel.

The transfer mechanism 28 is, for example, a linear motor type mechanism, and transfers the substrate holder 24 to each tank of the plating processing part 4. The transfer mechanism 28 transfers the substrate holders 24 one after another by utilizing the time lag of the processes in each plating tank 42.

The control part 6 is formed by a microcomputer, and includes a CPU that executes various operation processes, a ROM that stores control programs and the like, a RAM that is used as a work area for storing data and executing programs, a non-volatile memory that retains stored contents even after power-off, an input/output interface, a timer for measuring time, and the like. In the embodiment, the control part 6 drives and controls each mechanism, but each mechanism may be provided with a control part. In that case, an integrated control part that controls the control parts of each mechanism may be provided.

With the above-described configuration, the plating device 1 generally performs the following operations.

First, the substrate transfer robot 22 removes the substrate W to be plated from the substrate delivery table 8 and sets it in the cleaning device 14. Upon receiving the substrate W, the cleaning device 14 performs a pre-cleaning process for removing organic substances and the like. When the pre-cleaning is completed, the substrate transfer robot 22 receives the substrate W from the cleaning device 14 and delivers it to the attaching and detaching mechanism 20. The attaching and detaching mechanism 20 sets the substrate W on the substrate holder 24 and mounts it on the holding mechanism 26.

The transfer mechanism 28 lifts up the holding mechanism 26 to transfer the substrate holder 24 and immerses the substrate W together with the substrate holder 24 in the pre-wet tank 30. As a result, the pre-wet process using degassed water is performed. In this embodiment, degassed water is stored in the pre-wet tank 30, but anything that may replace the air in the resist opening on the surface of the substrate and may fill the resist opening with liquid may be used, and the disclosure is not limited to using degassed water.

Further, if the pre-wetting process in the cleaning device 14 is sufficient, the pre-wet tank 30 is not necessarily provided.

The transfer mechanism 28 subsequently removes the substrate holder 24 from the pre-wet tank 30, transfers it, and immerses it in the pre-soak tank 32. A chemical solution such as sulfuric acid or hydrochloric acid is stored in the pre-soak tank 32. In the case where an oxide film is formed on the seed layer (conductive layer) of the substrate W, it is removed by performing a pre-soak process with this chemical solution. In this way, a clean metal surface of the seed layer may be exposed.

The transfer mechanism 28 subsequently removes the substrate holder 24 from the pre-soak tank 32, transfers it, and immerses it in the rinse tank 34. As a result, the chemical solution adhering to the substrate W is washed away with deionized water. The transfer mechanism 28 subsequently immerses the substrate W in an empty plating tank 42. Further, although copper plating is performed in the plating process in the embodiment, nickel plating, gold plating or other plating may be performed by changing the plating solution supplied to the plating tanks 42.

The substrate W plated in this way is cleaned in the rinse tank 38 and then dried in the blow tank 36. Then, it is transferred to the attaching and detaching mechanism 20. The attaching and detaching mechanism 20 removes the substrate holder 24 from the holding mechanism 26 and removes the substrate W from the substrate holder 24. The substrate transfer robot 22 receives the substrate W from the attaching and detaching mechanism 20 and sets it on the cleaning device 16. Upon receiving the substrate W, the cleaning device 16 performs a post-cleaning process.

Figure 2:
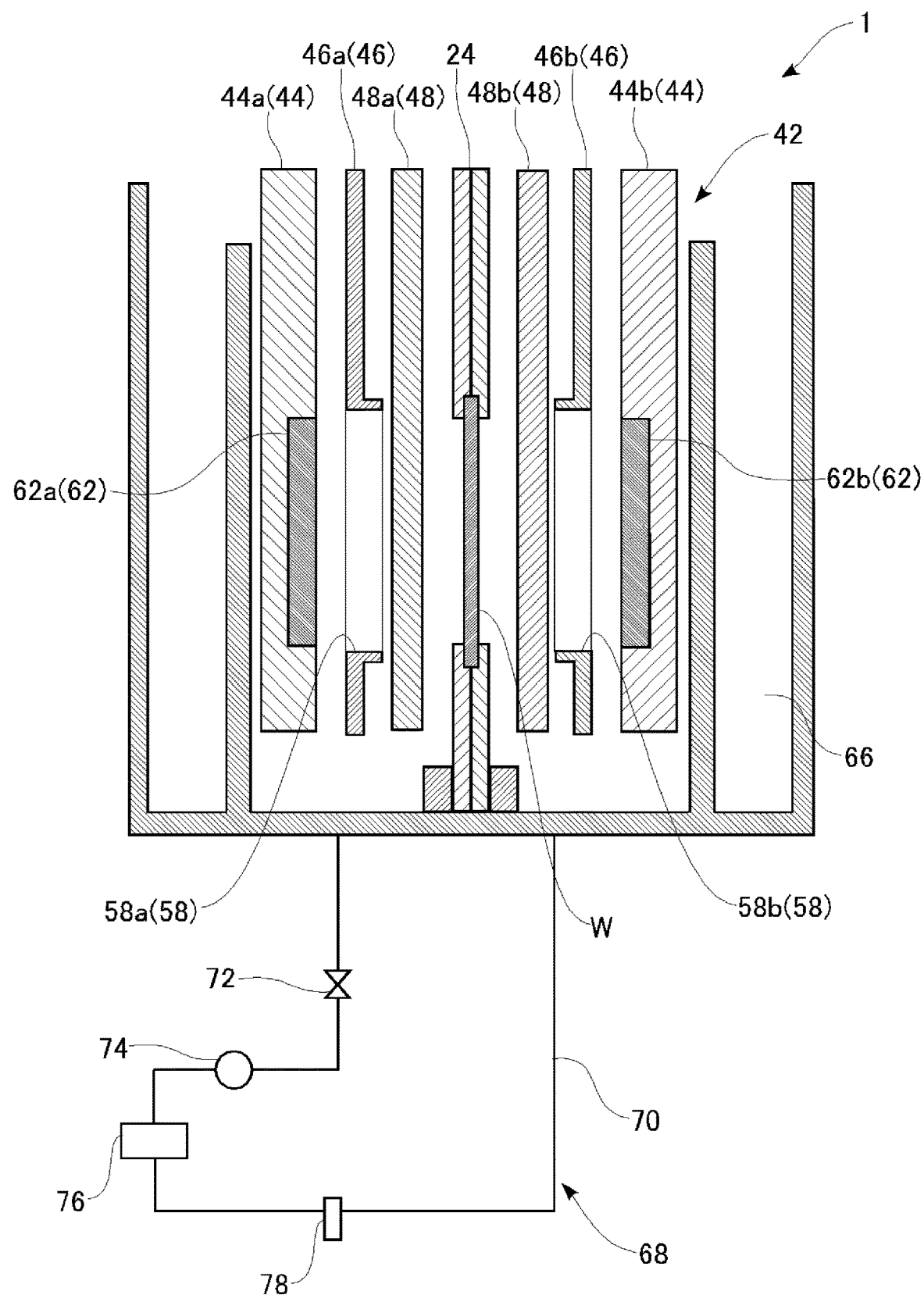
FIG. 2 is a view showing an overview of the plating tank.

FIG. 2 is a view showing an overview of the plating tank 42. In this embodiment, two surfaces of the substrate W are plated. The plating tank 42 includes a first anode holder 44a, a first regulation plate 46a, a first paddle 48a, the substrate holder 24, a second paddle 48b, a second regulation plate 46b, and a second anode holder 44b. A first anode 62a is held by the first anode holder 44a. The first anode 62a is connected to an external power supply via a wiring inside the first anode holder 44a. Further, a second anode 62b is held by the second anode holder 44b. The second anode 62b is connected to the external power supply via a wiring inside the second anode holder 44b. The substrate W is held by the substrate holder 24. During the plating process, the first anode holder 44a is disposed to face a first surface (front surface) of the substrate W, and the second anode holder 44b is disposed to face a second surface (back surface) of the substrate W.

The first regulation plate 46a is provided between the first anode holder 44a and the substrate holder 24. The first regulation plate 46a is provided with a first opening 58a, and an end part of this opening is disposed to cover a peripheral part of the first surface of the substrate W. The electric field between the first regulation plate 46a and the substrate W is adjusted by adjusting the size of the first opening 58a. The first paddle 48a for stirring the plating solution in the vicinity of the front surface of the substrate W is provided between the first anode holder 44a and the substrate holder 24. The first paddle 48a is, for example, a rod-shaped member and is provided in the plating tank 42 to face the vertical direction. The first paddle 48a is configured to be movable in parallel with respect to the two surfaces of the substrate W by a driving device (not shown).

Further, the second regulation plate 46b is provided between the second anode holder 44b and the substrate holder 24. The second regulation plate 46b is provided with a second opening 58b, and an end part of this opening is disposed to cover a peripheral part of the second surface of the substrate W. The electric field between the second regulation plate 46b and the substrate W is adjusted by adjusting the size of the second opening 58b. The second paddle 48b for stirring the plating solution in the vicinity of the back surface of the substrate W is provided between the second anode holder 44b and the substrate holder 24. The second paddle 48b is, for example, a rod-shaped member and is provided in the plating tank 42 to face the vertical direction. The second paddle 48b is configured to be movable in parallel with respect to the two surfaces of the substrate W by a driving device (not shown).

When a voltage is supplied from the external power supply between the first anode 62a and the substrate W, an electric current flows in a path from the external power supply through the first anode 62a, the plating solution, the substrate W, and returning to the external power supply. Further, when a voltage is supplied from the external power supply between the second anode 62b and the substrate W, an electric current flows in a path from the external power supply through the second anode 62b, the plating solution, the substrate W, and returning to the external power supply. By these electric currents, copper plating is performed on the two surfaces of the substrate W.

An outer tank 66 for receiving the plating solution overflowing from the plating tank 42 is provided on an outer periphery of the plating tank 42. The plating device 1 includes a circulation mechanism 68 that circulates the plating solution between the plating tank 42 and the outer tank 66. The circulation mechanism 68 includes a circulation line 70 that connects the outer tank 66 and the plating tank 42. The circulation line 70 is provided with a valve 72, a pump 74, a temperature control device 76, and a filter 78, respectively.

Hereinafter, the first anode holder 44a and the second anode holder 44b are simply referred to as the anode holder 44 and are not given identifiers unless otherwise specified. Similarly, the first opening 58a and the second opening 58b are referred to as the opening 58; the first regulation plate 46a and the second regulation plate 46b are referred to as the regulation plate 46; the first paddle 48a and the second paddle 48b are referred to as the paddle 48; and the first anode 62a and the second anode 62b are referred to as the anode 62. In addition, as shown in FIG. 2, the anode holder 44, the regulation plate 46, and the substrate holder 24 are disposed to face each other.

Figure 3:
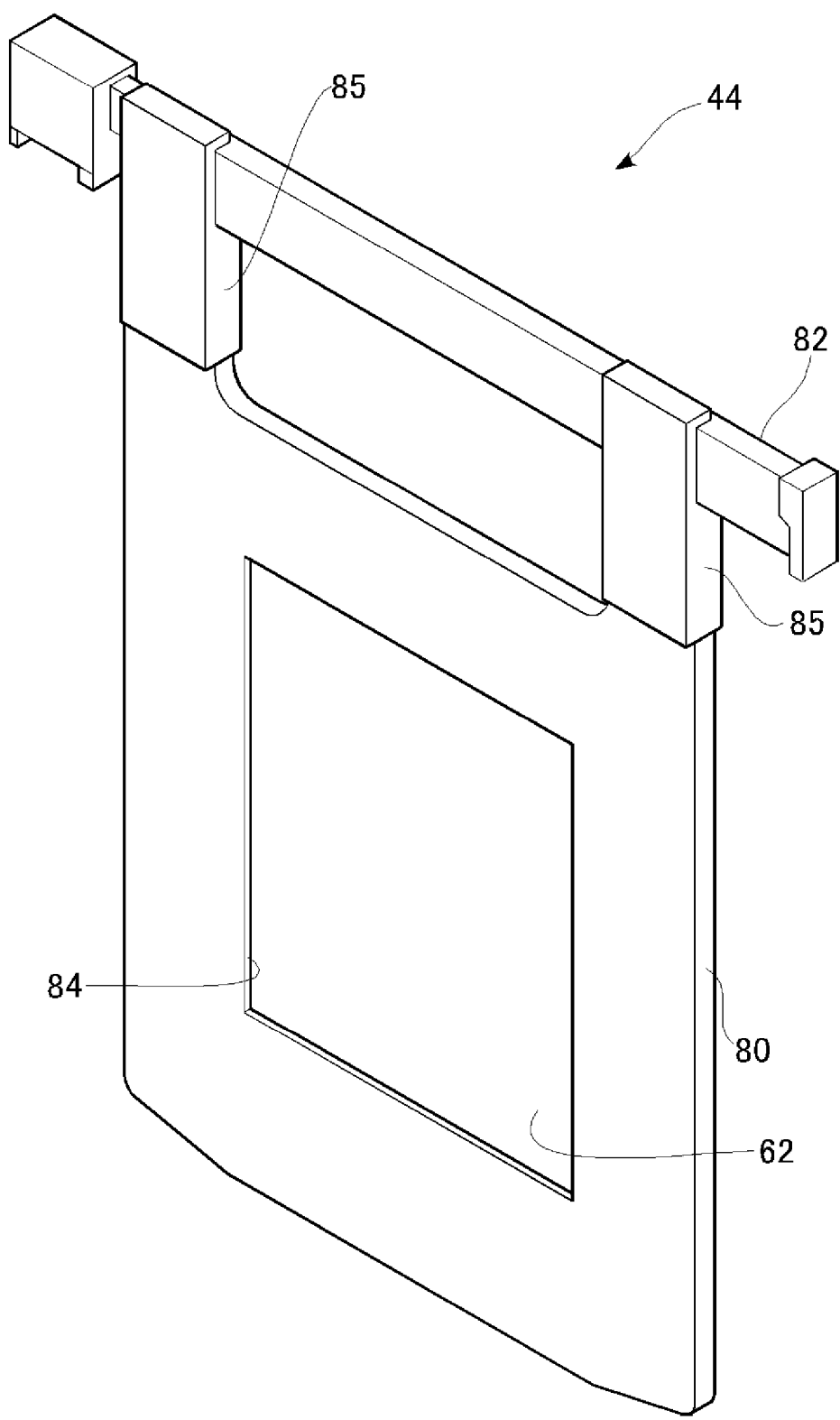
FIG. 3 is a perspective view showing a structure of the anode holder.

FIG. 3 is a perspective view showing a structure of the anode holder 44.

The anode holder 44 includes a substantially rectangular holder body 80 and a rectangular arm part 82. The holder body 80 has an opening 84. The holder body 80 is configured to hold the anode 62 and expose a surface of the anode 62 from the opening 84. The arm part 82 is provided above the holder body 80, and a connecting part 85 that connects the arm part 82 and an upper end part of the holder body 80 is provided. The holder body 80 is disposed in the plating device 1 (see FIG. 2) in a way that two end parts of the arm part 82 are supported by an upper surface of the plating tank 42 (see FIG. 2). In addition, a power supply terminal (not shown) electrically connected to an external electrode provided on the upper surface of the plating tank 42 is provided on the end part of the arm part 82.

Figure 4:
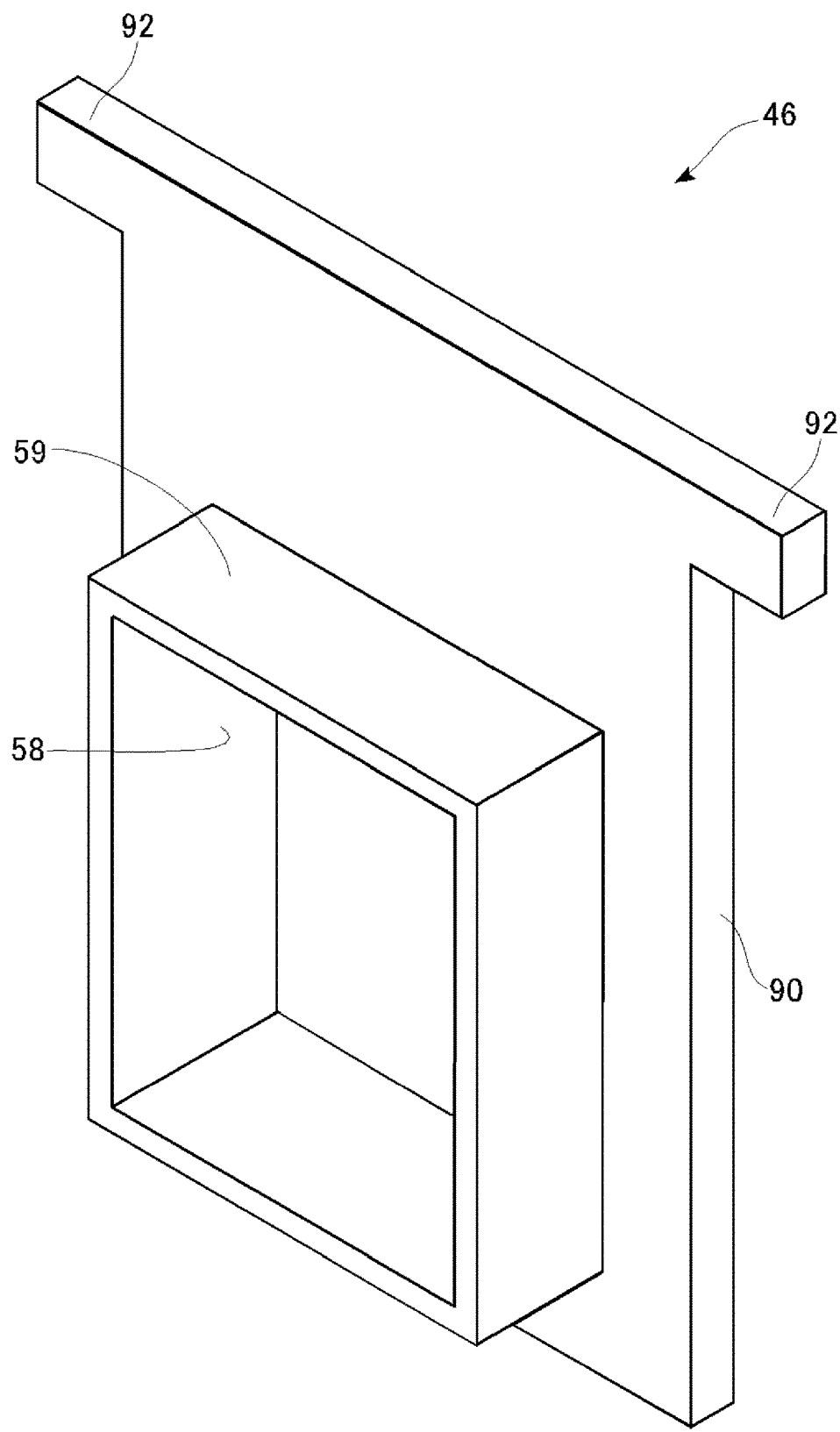
FIG. 4 is a perspective view showing a structure of the regulation plate.

FIG. 4 is a perspective view showing a structure of the regulation plate 46.

The regulation plate 46 includes a substantially rectangular mask body 90 and a tubular edge part 59. The mask body 90 is made of a material having a function of shielding an electric field, and has the rectangular opening 58 at a substantially central part thereof. The opening 58 is formed by the mask body 90 and the edge part 59 provided on the mask body 90. A pair of rectangular arm parts 92 are provided on left and right end parts of an upper part of the mask body 90. The regulation plate 46 is disposed in the plating device 1 (see FIG. 2) in a way that two end parts of the arm parts 92 are supported by the upper surface of the plating tank 42 (see FIG. 2). The electric field is directed through the opening 58 to the substrate W (FIG. 2). When the opening 58 of the regulation plate 46 is made smaller, the thickness of the plating film in the peripheral part of the surfaces of the substrate W and in a region slightly inward of the peripheral part becomes smaller.

Figure 5:
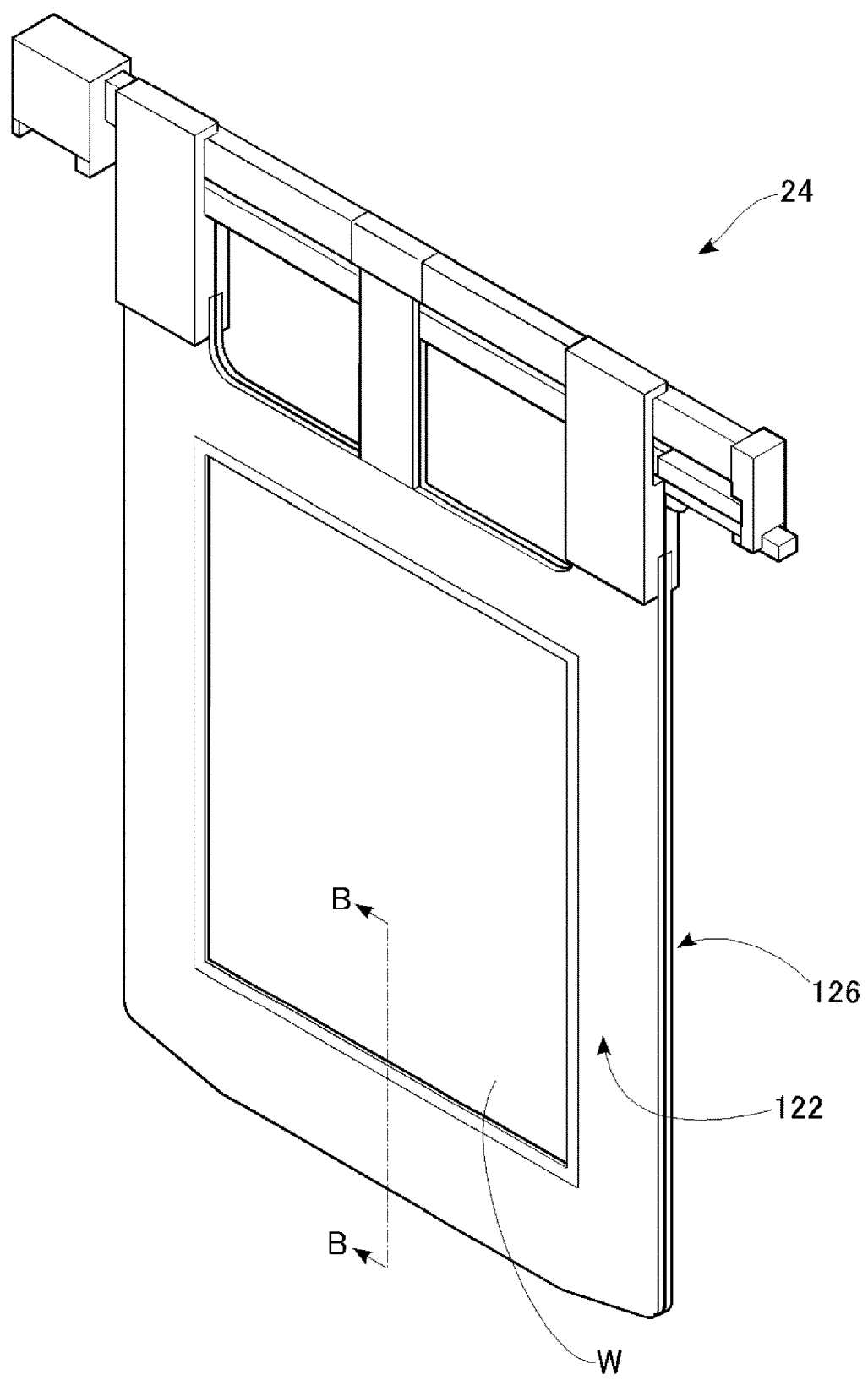
FIG. 5 is a perspective view of the substrate holder.
Figure 6:
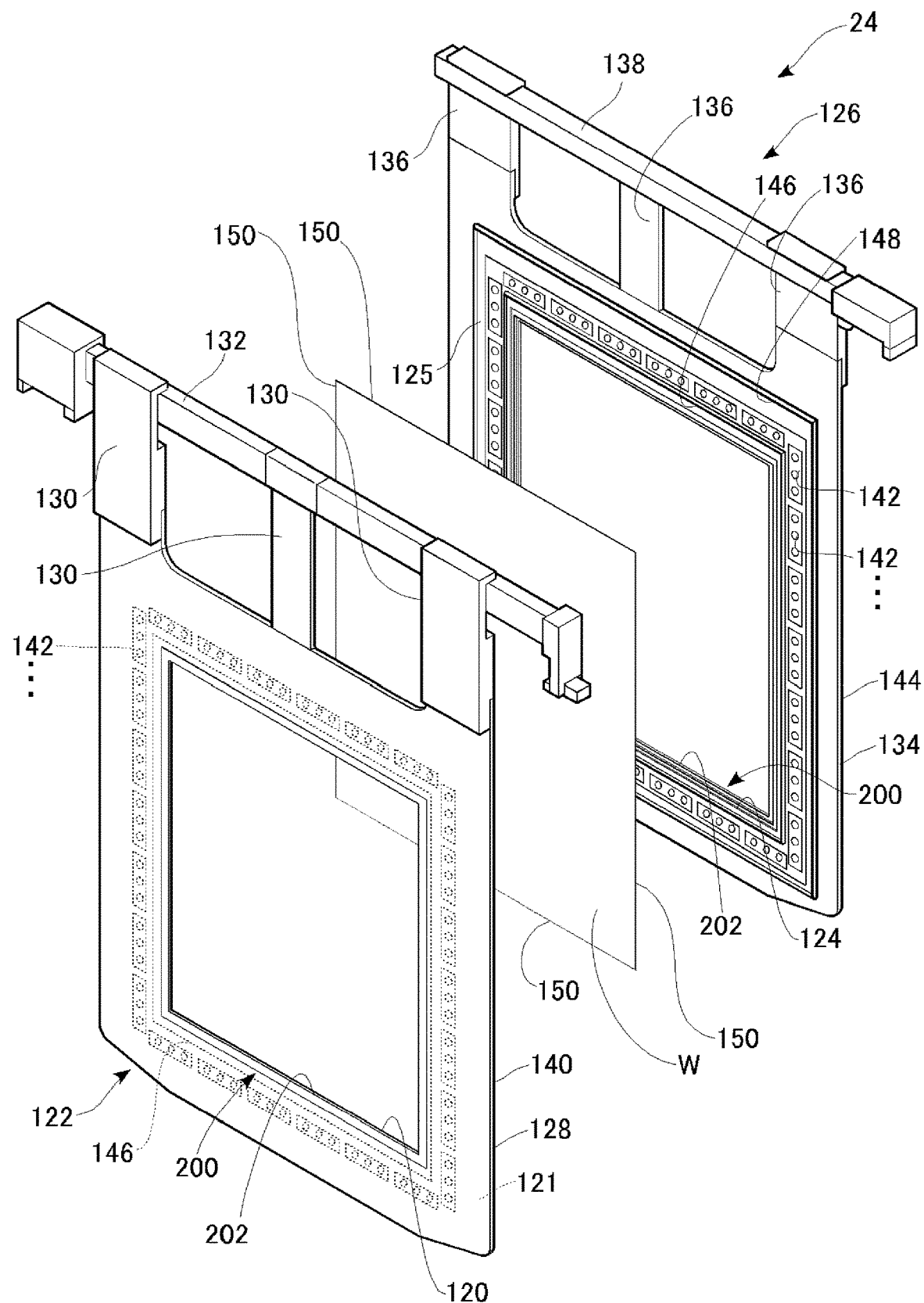
FIG. 6 is an exploded perspective view of the substrate holder.

FIG. 5 is a perspective view of the substrate holder 24. FIG. 6 is an exploded perspective view of the substrate holder 24.

The substrate holder 24 includes a first holding member 122 and a second holding member 126. The first holding member 122 and the second holding member 126 are formed of, for example, a metal such as Ti, and their surfaces are coated with an insulating coating. As shown in FIG. 5, the substrate W is held by the substrate holder 24 by being clamped between the first holding member 122 and the second holding member 126.

As shown in FIG. 6, the first holding member 122 has a first opening 120 and the second holding member 126 has a second opening 124. The substrate W is held by the first holding member 122 and the second holding member 126 so that the front and back surfaces to be plated are exposed by the first opening 120 and the second opening 124. That is, the first holding member 122 and the second holding member 126 hold the substrate W in a way that only the peripheral part of the substrate W is clamped from the two sides. Further, in the embodiment, the first opening 120 and the second opening 124 have the same shape.

The first holding member 122 includes a frame-shaped first body part 128 in which the first opening 120 is formed, three first connecting parts 130, and a first arm part 132. A first arm part 132 is disposed above the first body part 128, and the first arm part 132 and the first body part 128 are bridged by the three first connecting parts 130. The second holding member 126 includes a frame-shaped second body part 134 in which the second opening 124 is formed, three second connecting parts 136, and a second arm part 138. The second holding member 126 also has the second arm part 138 disposed above the second body part 134, and the second arm part 138 and the second body part 134 are bridged by the three second connecting parts 136.

The first body part 128 includes a frame-shaped first body 140, substrate contacts 142 (contacts), and a frame-shaped inner seal 146. The substrate contacts 142 and the inner seal 146 are provided on a surface of the first body 140 facing the second holding member 126. This facing surface is a first holding surface 121 that holds the substrate W. The second body part 134 includes a frame-shaped second body 144, substrate contacts 142 (contacts), a frame-shaped inner seal 146, and a frame-shaped outer seal 148. The substrate contacts 142, the inner seal 146, and the outer seal 148 are provided on a surface of the second body 144 facing the first holding member 122. This facing surface is a second holding surface 125 that holds the substrate W.

The inner seals 146 are provided on the first body 140 and the second body 144 in a way along the first opening 120 and the second opening 124. Further, the outer seal 148 is provided on the second body 144 to surround the inner seals 146. The substrate contacts 142 are provided on the outer periphery of the inner seals 146. When the first holding member 122 and the second holding member 126 clamp the substrate W, the inner seals 146 and the substrate contacts 142 contact the substrate W. In addition, the outer seal 148 contacts the first body 140. As a result, the substrate contacts 142 are surrounded by the inner seals 146, the outer seal 148, the first body 140, and the second body 144.

Frame-shaped holder masks 200 (shielding parts) are provided on the peripheral parts of the first opening 120 and the second opening 124. The holder masks 200 are made of a dielectric material such as resin. The holder masks 200 have openings 202 smaller than the first opening 120 and the second opening 124, and are provided in a way to cover the peripheral parts of the surfaces of the substrate W on both surfaces of the substrate holder 24. With this structure, the holder masks 200 shield the electric field from the peripheral parts of the surfaces of the substrate W. That is, when the openings 202 of the holder masks 200 are made smaller, the thickness of the plating films at the peripheral parts of the substrate W becomes smaller. Details of the shape of the holder masks 200 will be described later.

The first connecting parts 130 and the second connecting parts 136 house a plurality of wirings (not shown) for supplying power from the external power supply to the substrate contacts 142. For a method of supplying power from the external power supply to the substrate contacts 142, for example, a known technique described in Japanese Laid-open No. 2019-7075 may be adopted. When the first body 140 and the second body 144 are engaged with each other, the substrate holder 24 is in the state shown in FIG. 5

In the embodiment, a plurality of substrate contacts 142 are disposed on the first body 140 and the second body 144 along the sides of the first opening 120 and the second opening 124. The substrate contacts 142 are disposed along all the lateral and vertical sides of the first opening 120 and the second opening 124. Hereinafter, in the substrate W, the sides along which the substrate contacts 142 are provided are referred to as "power feeding sides 150."

Figure 7:
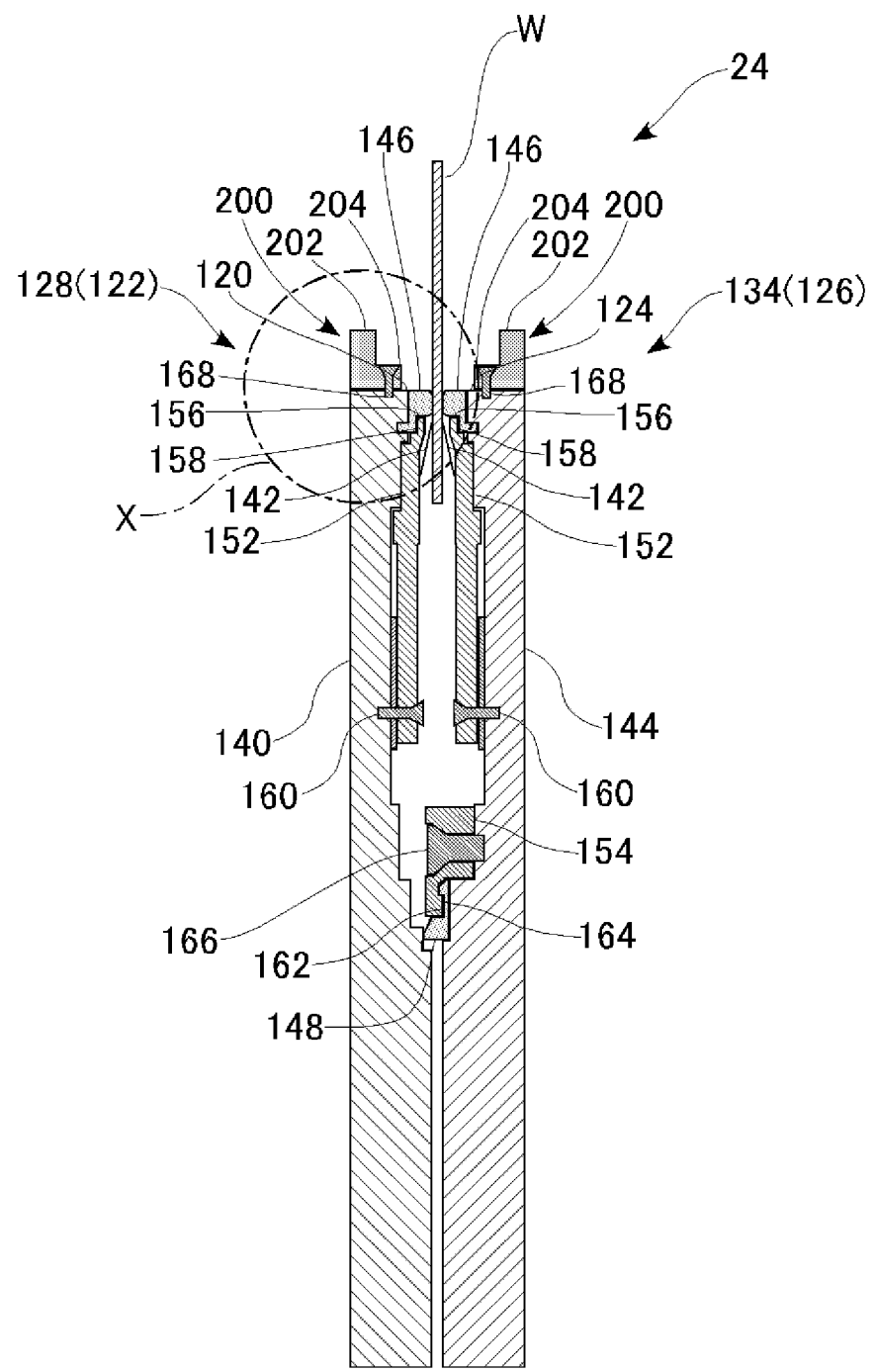
FIG. 7 is a sectional view taken along the line B-B in FIG. 5.

FIG. 7 is a sectional view taken along the line B-B in FIG. 5.

Seal holders 152 and 154 are provided between the first body part 128 and the second body part 134. The two seal holders 152 are for fixing the two inner seals 146 to the first body 140 and the second body 144, respectively. Step parts 156 are provided on the outer peripheral surface of the inner seals 146. Step parts 158 are also provided on the end parts of the seal holders 152. The step parts 156 and the step parts 158 are formed in complementary shapes to each other. The inner seals 146 and the seal holders 152 are engaged with each other in a way that the step parts 156 and the step parts 158 contact each other.

The two seal holders 152 are fixed to the first body part 128 and the second body part 134 by screws 160, respectively. With this structure, the inner seals 146 are fixed to the first body 140 and the second body 144 via the seal holders 152.

The seal holder 154 is for fixing the outer seal 148 to the second body 144. A step part 162 is provided on the end part of the outer seal 148. A step part 164 is also provided on the end part of the seal holder 154. The step part 162 and the step part 164 are formed in complementary shapes to each other, and the outer seal 148 and the seal holder 154 are engaged with each other in a way that the step part 162 and the step part 164 contact each other. The seal holder 154 is fixed to the second body part 134 by a screw 166. With this structure, the outer seal 148 is fixed to the second body 144 via the seal holder 154.

The substrate W is in contact with the inner seals 146. Further, the outer seal 148 fixed to the second body 144 is in contact with the first body 140. The substrate contacts 142 are in contact with the substrate W between the inner seals 146 and the outer seal 148. That is, the substrate contacts 142 are accommodated in the space where the sealing performance is secured by the inner seals 146 and the outer seal 148. With this structure, even in the case where the substrate holder 24 is immersed in the plating solution in the plating tank 42 (see FIG. 2), the substrate contacts 142 do not have to come into contact with the plating solution.

The holder masks 200 are provided on the first opening 120 and the second opening 124, respectively. As shown in FIG. 7, in the embodiment, the holder masks 200 has two-stepped step parts 204. The protruding length of the step part 204 from the first opening 120 (second opening 124) is short on the side close to the substrate W and long on the side far from the substrate W. In other words, the step part 204 is configured to have a shorter distance from the substrate W when it is closer to the first opening 120 (second opening 124) and to have a longer distance from the substrate W as it becomes farther from the first opening 120 (second opening 124). The holder masks 200 are fixed to the first body 140 and the second body 144 by screws 168, respectively.

Further, as described with reference to FIG. 6, the first opening 120 and the second opening 124 have the same shape. As shown in FIG. 7, the first opening 120 and the second opening 124 are located at the same height in the substrate holder 24. That is, the first opening 120 and the second opening 124 overlap each other in the direction perpendicular to the substrate W (the horizontal direction in FIG. 7).

Figure 8:
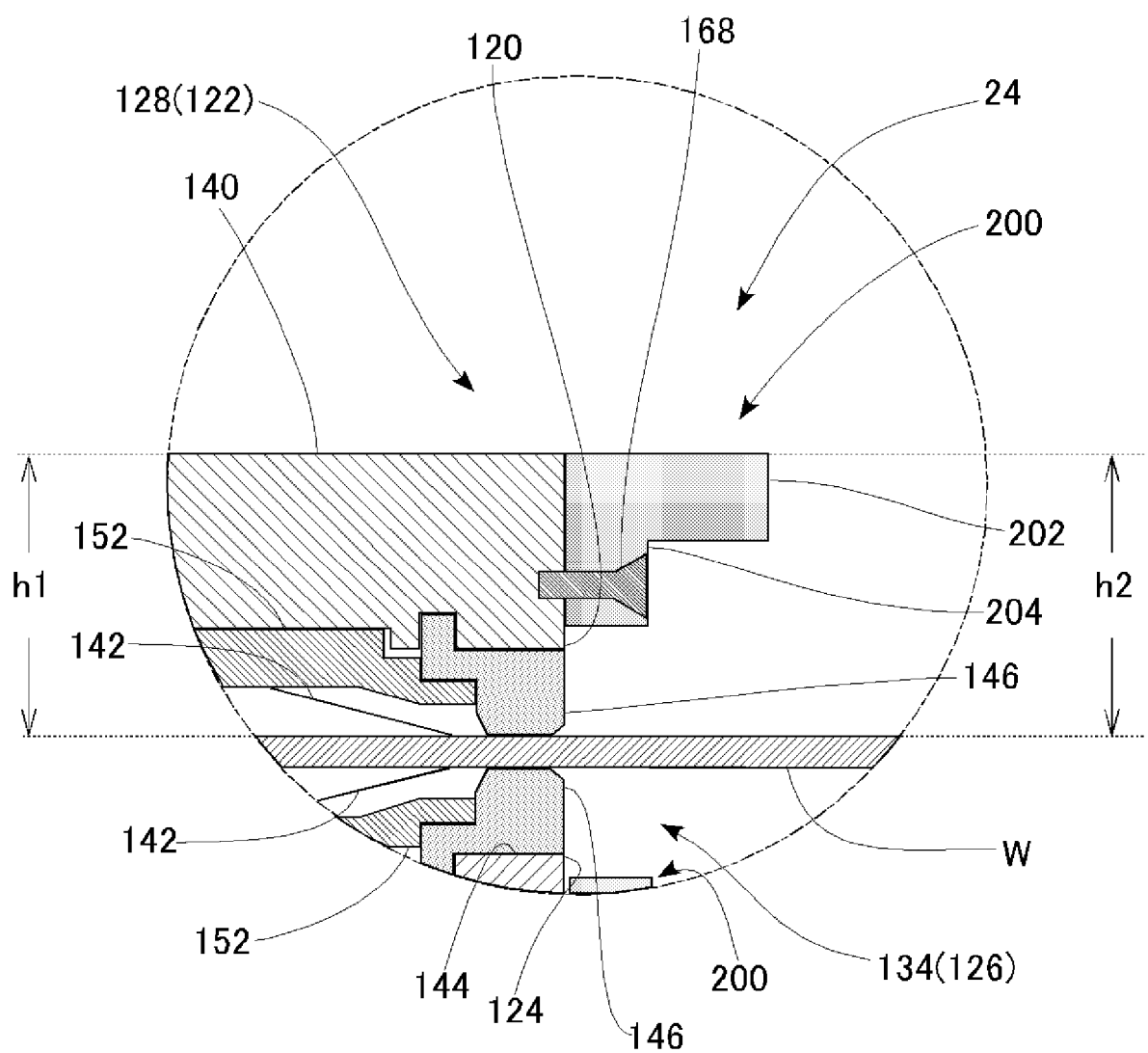
FIG. 8 is an enlarged view of the part X in FIG. 7.

FIG. 8 is an enlarged view of the part X in FIG. 7. In FIG. 8, the substrate holder 24 is shown rotated 90 degrees to the right from the state shown in FIG. 7. Hereinafter, in describing the cross-sectional shape of the holder masks 200, the side provided on the first holding member 122 (above the substrate W in FIG. 8) will be described, and the description of the side provided on the second holding member 126 will be omitted. Further, the first holding member 122 and the second holding member 126 have the same structure, and the holder masks 200, the inner seals 146, the substrate contacts 142, and the like for the substrate W are provided at symmetrical positions on the two sides of the substrate W.

As described with reference to FIG. 6, the first opening 120 is formed in the first body part 128. As shown in FIG. 8, the first opening 120 may be the inner surface of the first body 140 or the inner surface of the inner seal 146. Alternatively, the first opening 120 may be the inner surface common to both the first body 140 and the inner seal 146. The first opening 120 may be a part in the vicinity of the substrate W that defines the size of a region where an electric field may be formed. The same applies to the second opening 124. Hereinafter, the first opening 120 (second opening 124), which is a part that defines the region where the electric field is formed, may be collectively referred to as "the opening of the substrate holder 24."

As described with reference to FIG. 7, the holder mask 200 has the step part 204. In FIG. 8, the holder mask 200 has a shape in which a part in the vicinity of the first opening 120 is thick and a part far from the first opening 120 is thin. Details of the operation of the step part 204 will be described later. The holder mask 200 is fixed to the inner surface of the first body 140 by the screw 168 at a position separated from the opening of the substrate holder 24. That is, the holder mask 200 protrudes from the inner surface of the first body 140 to the inner side of the first opening 120 (the opening of the substrate holder 24). The screw 168 is attached in a way of being buried in the holder mask 200. In addition, in the embodiment, a height h1 from the surface of the substrate W to the upper end surface of the first holding member 122 and a height h2 from the surface of the substrate W to the upper end surface of the holder mask 200 are set to be equal. The same applies to the second holding member 126 (see FIG. 7) and the holder mask 200 attached to the second holding member 126.

Figure 9:
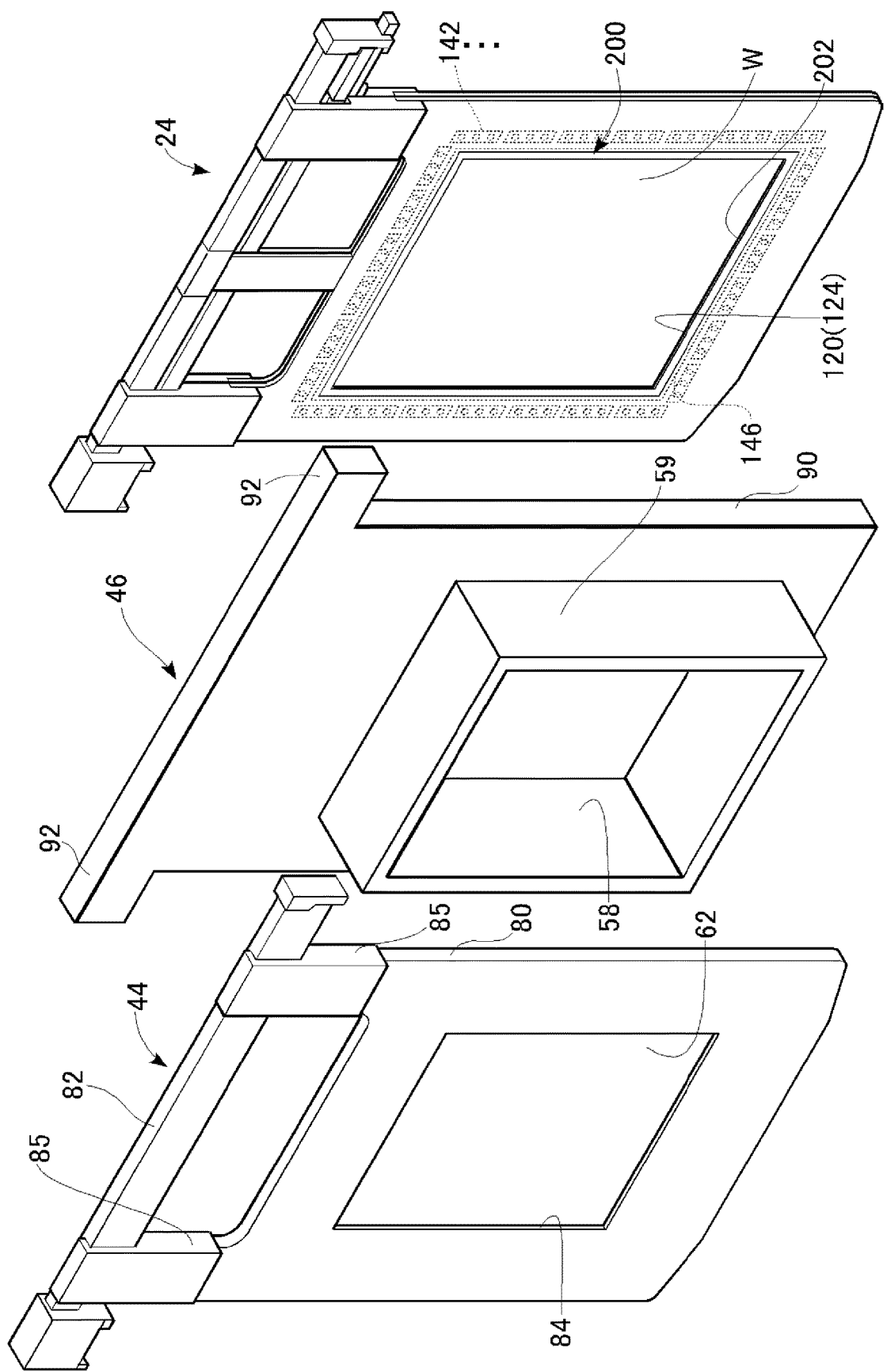
FIG. 9 is a conceptual view showing a positional relationship among the anode holder, the regulation plate and the substrate holder.

FIG. 9 is a conceptual view showing a positional relationship among the anode holder 44, the regulation plate 46 and the substrate holder 24.

For an example, the size of each opening (length of one side or opening area) increases in the order of the opening 84, the opening 58 and the opening 202 for the exposed region of the substrate W.

As described with reference to FIG. 4, when the electric field is shielded by the regulation plate 46 (mask body 90), the film thickness decreases from the peripheral part of the surface of the substrate W to the region slightly inward thereof. Further, as described with reference to FIG. 6, when the electric field is shielded by the holder mask 200, the film thickness of the peripheral part on the surface of the substrate W becomes smaller. In the embodiment, since the contact position between the substrate W and the substrate contacts 142 is the peripheral part of the substrate W, the film thickness of the peripheral part of the substrate W is likely to increase due to the terminal effect.

If the film thickness at the peripheral part of the substrate W is made to be an appropriate size by using only the regulation plate 46, the film thickness at the region slightly inward of the peripheral part becomes too small. Therefore, while the opening 58 of the regulation plate 46 is made large to suppress the electric field shielding function of the regulation plate 46, the holder mask 200 is provided to superimpose the electric field shielding function. By shielding the electric field using both the regulation plate 46 and the holder mask 200, the film thickness in the peripheral part of the substrate W and the region slightly inward thereof is adjusted.

Figure 10:
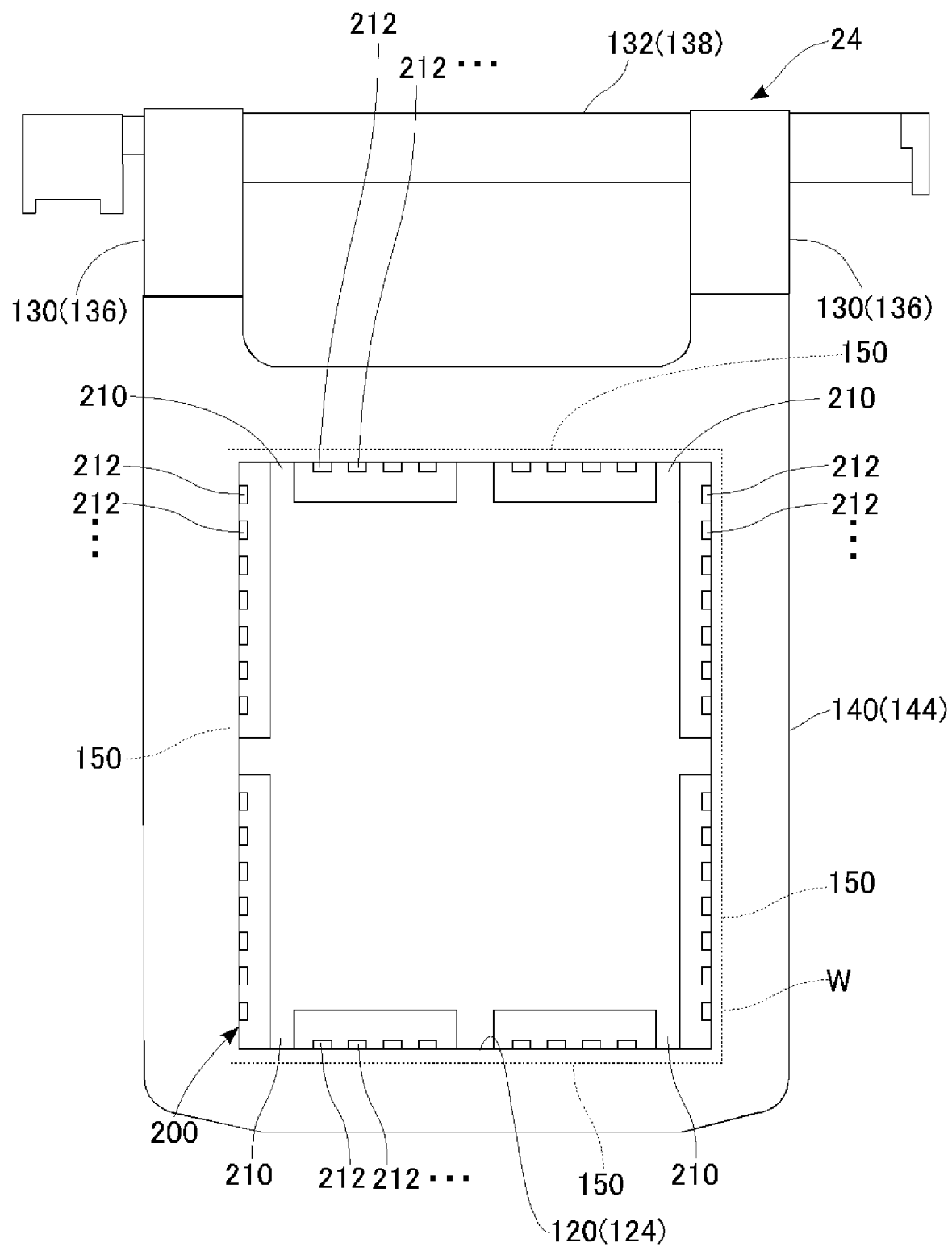
FIG. 10 is a conceptual view of the substrate holder when viewed from the front.

Here, the shape of the holder mask 200 will be described in more detail. FIG. 10 is a conceptual view of the substrate holder 24 when viewed from the front. The holder mask 200 is provided with gaps 210 and liquid drain holes 212 that are rectangular in a front view. The gaps 210 are gaps, openings, or steps provided in the holder mask 200. The gaps 210 are provided at positions corresponding to the four corners (corner parts) of the substrate W in the holder mask 200. That is, the gaps 210 are provided at the four corners (corner parts) of the frame-shaped holder mask 200. In the embodiment, the gaps 210 are provided at positions corresponding to the lateral sides of the first opening 120 (second opening 124), and its width is about 0.5 mm to 10 mm. Details of the operation of the gaps 210 will be described later.

The liquid drain holes 212 are provided to efficiently remove the plating solution from the first opening 120 (second opening 124) when the substrate holder 24 is removed from the plating tank 42 (see FIG. 2). A plurality of liquid drain holes 212 are provided in the holder mask 200 to open in the direction perpendicular to the substrate W. In the embodiment, the liquid drain holes 212 are provided on all four sides of the holder mask 200 in order to make the electric field shielding effects on each side of the substrate W as uniform as possible. Further, the sectional view taken along the line B-B (the B-B part in FIG. 5) shown in FIG. 7 is a sectional view of the substrate holder 24 at a position in the holder mask 200 that does not include the gaps 210 and the liquid drain holes 212.

The operation of the gaps 210 will be described.

In the case where the holder mask 200 has no gaps at its four corners and the opening 202 is rectangular like the substrate W, the inventors of the disclosure have found that there is a problem that the film thickness on the substrate W located immediately below or slightly outside the corners of the opening 202 becomes too small. It is considered that this is because the corners of the substrate W are influenced by the electric field shielding by the holder masks 200 corresponding to the two sides forming the corners. As a result, at the corners of the substrate W, the electric field is shielded more than necessary, and the film thickness tends to be reduced. In this embodiment, the gaps 210 are provided at the four corners of the frame-shaped holder mask 200. With this structure, the shielding of the electric field from the corners of the substrate W is attenuated, and the film thickness at the corners of the substrate becomes appropriate. Therefore, the in-plane uniformity of the substrate W is improved.

Figure 11:
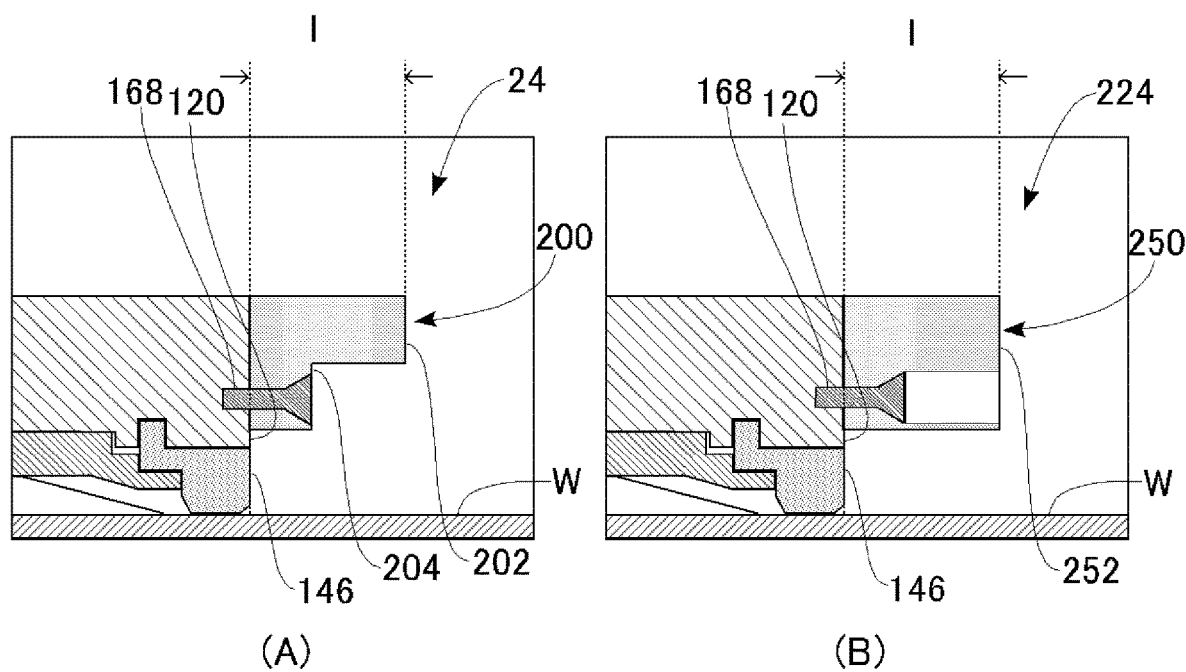
FIG. 11 are diagrams showing the in-plane uniformity of the substrate with respect to the presence or absence of the step part in the holder mask.
Figure 11:
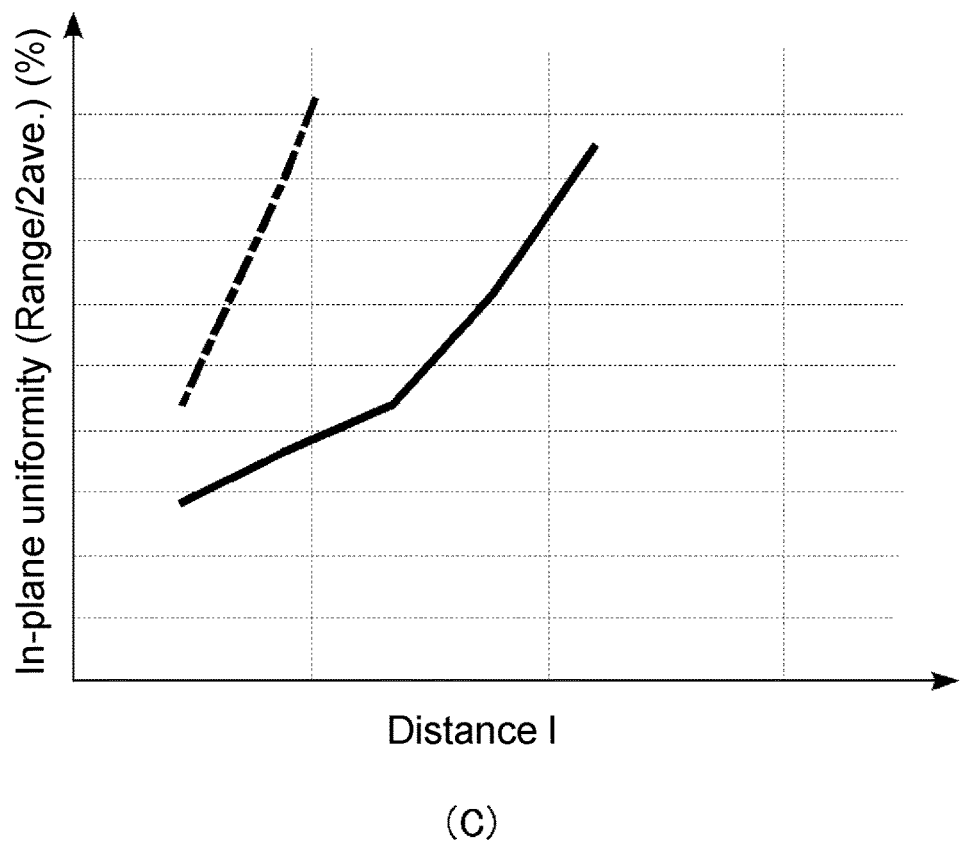

The operation of the step part 204 will be described. FIG. 11 are diagrams showing the in-plane uniformity of the substrate W with respect to the presence or absence of the step part 204 in the holder mask 200. In FIG. 11, (A) is a cross-sectional view of the substrate holder 24 in the vicinity of the holder mask 200 according to the embodiment, and (B) is a cross-sectional view of a substrate holder 224 in the vicinity of a holder mask 250 according to a comparative example. In FIG. 11, (C) is a graph showing the in-plane uniformity with respect to the protrusion amount of the holder mask 200 (holder mask 250) from the first opening 120 (the opening of the substrate holder) for the embodiment and the comparative example.

The substrate holder 224 according to the comparative example is different from the substrate holder 24 according to the embodiment in the shape of the holder mask 250. Like the holder mask 200, the holder mask 250 is made of a dielectric material. The holder mask 250 has a rectangular cross-sectional shape and does not have a step part. The holder mask 250 has an opening 252 smaller than the first opening 120.

The protruding length of each of the holder masks 200 and 250 from the first opening 120 is a distance l. The distance l may also be said to be the protrusion amount of each of the holder masks 200 and 250 from the opening of the substrate holder.

The graph shown in (C) of FIG. 11 represents the in-plane uniformity of the substrate W with respect to the protrusion amount from the opening of the substrate holder in each of the holder masks 200 and 250. The solid line shows the substrate holder 24 according to the embodiment, and the dash-dotted line shows the substrate holder 224 according to the comparative example.

When the distances l are equal, regarding the substrate holder 24 and the substrate holder 224, the substrate holder 24 has a smaller Range/2ave. That is, the substrate holder 24 has higher in-plane uniformity. It is considered that this is because the holder mask 250 has a larger electric field shielding width at a position closer to the substrate W than the holder mask 200, and the electric field shielding function of the holder mask 250 is too strong. From the graph shown in (C) of FIG. 11, it may be said that the in-plane uniformity of the substrate W is improved when the holder mask 200 with the step part 204 is adopted, compared with when the holder mask 250 without a step part is adopted. That is, by providing the step part 204, the in-plane uniformity of the substrate W is improved.

As described above, according to the embodiment, the frame-shaped holder mask 200 is provided on the substrate holder 24 at the position corresponding to the peripheral part of the substrate W, and the gaps 210 are provided in the vicinity of the four corners of the holder mask 200. With this structure, the electric field shielding function of the holder mask 200 with respect to the corners of the surfaces of the substrate W does not become too strong, and the thickness of the plating film at the corners does not become too small. Therefore, the in-plane uniformity of the substrate W may be improved.

According to the embodiment, the holder mask 200 has the step part 204. The step part 204 is configured to have a shorter distance from the substrate W when it is closer to the first opening 120 and the second opening 124 (opening), and to have a longer distance from the substrate W when it is farther from the opening. By providing the holder mask 200 with the step part 204 that gradually increases the distance from the surface of the substrate W from the inner side of the opening, the electric field shielding function of the holder mask 200 with respect to the peripheral part of the substrate W may be made appropriate. Therefore, the in-plane uniformity of the substrate W may be improved.

According to the embodiment, the heights of the first holding member 122 (second holding member 126) and the holder mask 200 from the substrate W are set to be equal. That is, the holder mask 200 does not protrude to the outer side from the end surface of the first holding member 122 (second holding member 126). Further, the holder mask 200 is attached to the inner surface of the first opening 120 (the second opening 124). In this attachment way, it is not necessary to provide a member (attachment member) for attaching the holder mask 200 to the substrate holder 24 on the surface of the first holding member 122 (second holding member 126) opposite to the surface facing the substrate W. Therefore, the substrate holder 24 may be made compact.

Figure 12:
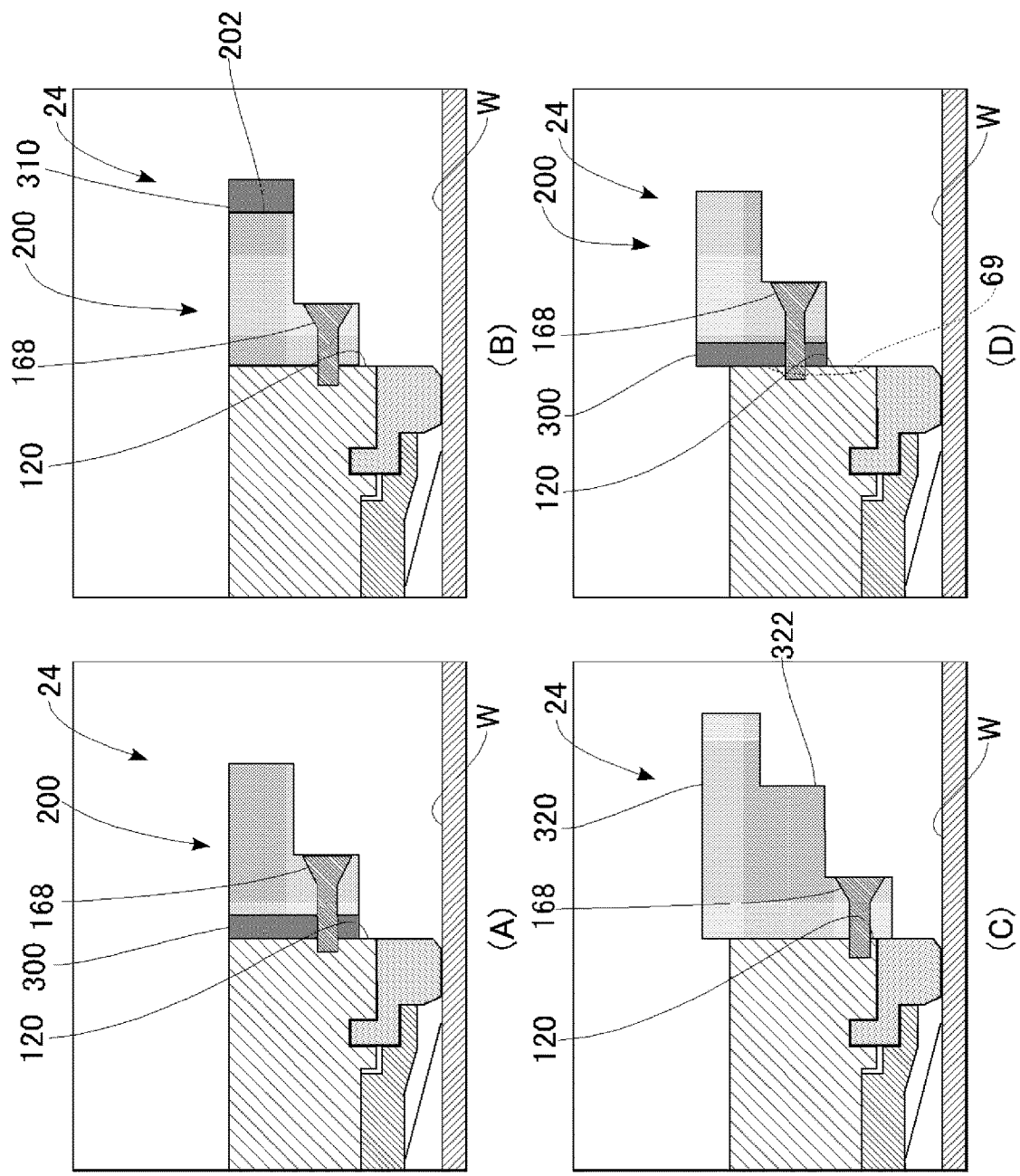
FIG. 12 are sectional views in the vicinity of a holder mask of the substrate holder according to modified examples of the first embodiment.

FIG. 12 are sectional views in the vicinity of a holder mask of the substrate holder 24 according to modified examples of the first embodiment. In FIG. 12, (A) shows the substrate holder 24 according to a first modified example; (B) shows the substrate holder 24 according to a second modified example; (C) shows the substrate holder 24 according to a third modified example; and (D) shows the substrate holder 24 according to a fourth modified example.

The thickness of the plating film extending from the peripheral part of the substrate W to the region slightly inward of the peripheral part varies depending on the size of the substrate W, the distance between the peripheral part of the substrate W and the power feeding sides, the strength of the electric field, and the like. Further, there is usually a non-plated region on the peripheral part of the substrate W. The place where the electric field is shielded by the holder mask is determined by various types of substrates W.

The substrate holder 24 according to the first modified example includes an additional mask 300 (second member) between the holder mask 200 (first member) and the first opening 120. The additional mask 300 is made of the same dielectric material as the holder mask 200. That is, in the substrate holder 24 of the first modified example, both the holder mask 200 and the additional mask 300 are "shielding parts." The additional mask 300 is fixed to the inner surface of the first opening 120 by the screw 168 together with the holder mask 200. By providing the additional mask 300 having different and appropriate thicknesses, the shielding length of the shielding parts of the substrate holder 24 to the inner side of the first opening 120 (inner side of the opening of the substrate holder 24) may be adjusted. Therefore, the film thickness of the peripheral part of various types of substrates W may be suppressed, and the in-plane uniformity of the substrates W may be improved.

The substrate holder 24 according to the second modified example includes an additional mask 310 in the opening 202 of the holder mask 200. The additional mask 310 is made of the same dielectric material as the holder mask 200 and is fixed to the opening 202 by a fixing method such as a screw. In the substrate holder 24 of the second modified example as well, by providing the additional mask 310 having different and appropriate sizes, the shielding length of the shielding parts to the inner side of the first opening 120 (inner side of the opening of the substrate holder 24) may be adjusted. Therefore, the film thickness of the peripheral part of various types of substrates W may be suppressed, and the in-plane uniformity of the substrates W may be improved.

In the substrate holder 24 according to the third modified example, the shape of a holder mask 320 is different from the shape of the holder mask 200. The holder mask 320 has a three-stepped step part 322. The step part 322 is configured to have a shorter distance from the substrate W when it is closer to the first opening 120, and to have a longer distance from the substrate W when it is farther from the first opening 120. Like the holder mask 200, the holder mask 320 is fixed to the inner surface of the first opening 120 (the inner surface of the opening of the substrate holder 24) by the screw 168. The holder mask 320 provided with the three-stepped step part 322 has an electric field shielding function different from that of the holder mask 200 provided with the two-stepped step part 204. Therefore, the film thickness of the peripheral part of the substrate W different from the substrate holder 24 according to the first embodiment may be suppressed, and the in-plane uniformity of the substrate W may be improved.

The substrate holder 24 according to the fourth modified example is provided with an adjustment component 69 for adjusting the position of the shielding parts (the holder mask 200 and the additional mask 300) in the first opening 120.

The adjustment component 69 may be any structure capable of changing the distance of the shielding parts to the substrate W along the inner side of the first opening 120 (opening of the substrate holder 24), such as a component having a long hole and capable of changing the fixing position of the screw 168. By providing the adjustment component 69, the substrate holder 24 of the fourth modified example may move in the direction in which the position of the shielding parts with respect to the substrate W becomes closer or farther. Therefore, the film thickness of the peripheral part of various types of substrates W may be suppressed, and the in-plane uniformity of the substrates W may be improved.

Second Embodiment

Figure 13:
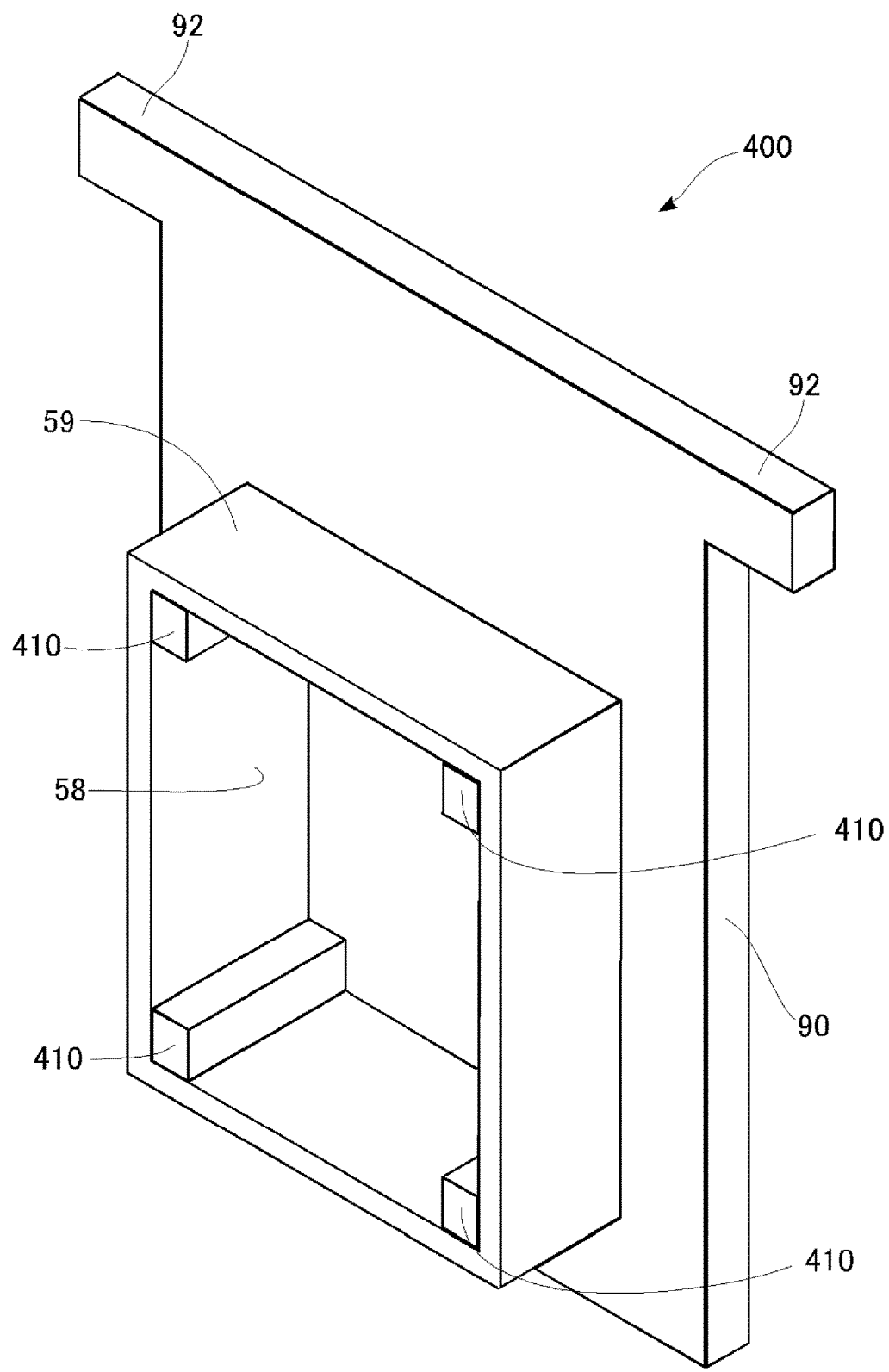
FIG. 13 is a perspective view showing a regulation plate according to a second embodiment.

FIG. 13 is a perspective view showing a regulation plate 400 according to a second embodiment. The regulation plate 400 has a structure in which corner masks 410 are provided on the regulation plate 46 according to the first embodiment.

The regulation plate 400 is provided with the rectangular corner masks 410 (shielding walls) at each of the four corners of the rectangular opening 58. Like the mask body 90, the corner masks 410 are made of a material having an electric field shielding function. The corner masks 410 protrude from the four corners (corner parts) of the opening 58 toward the inner side of the opening 58.

Figure 14:
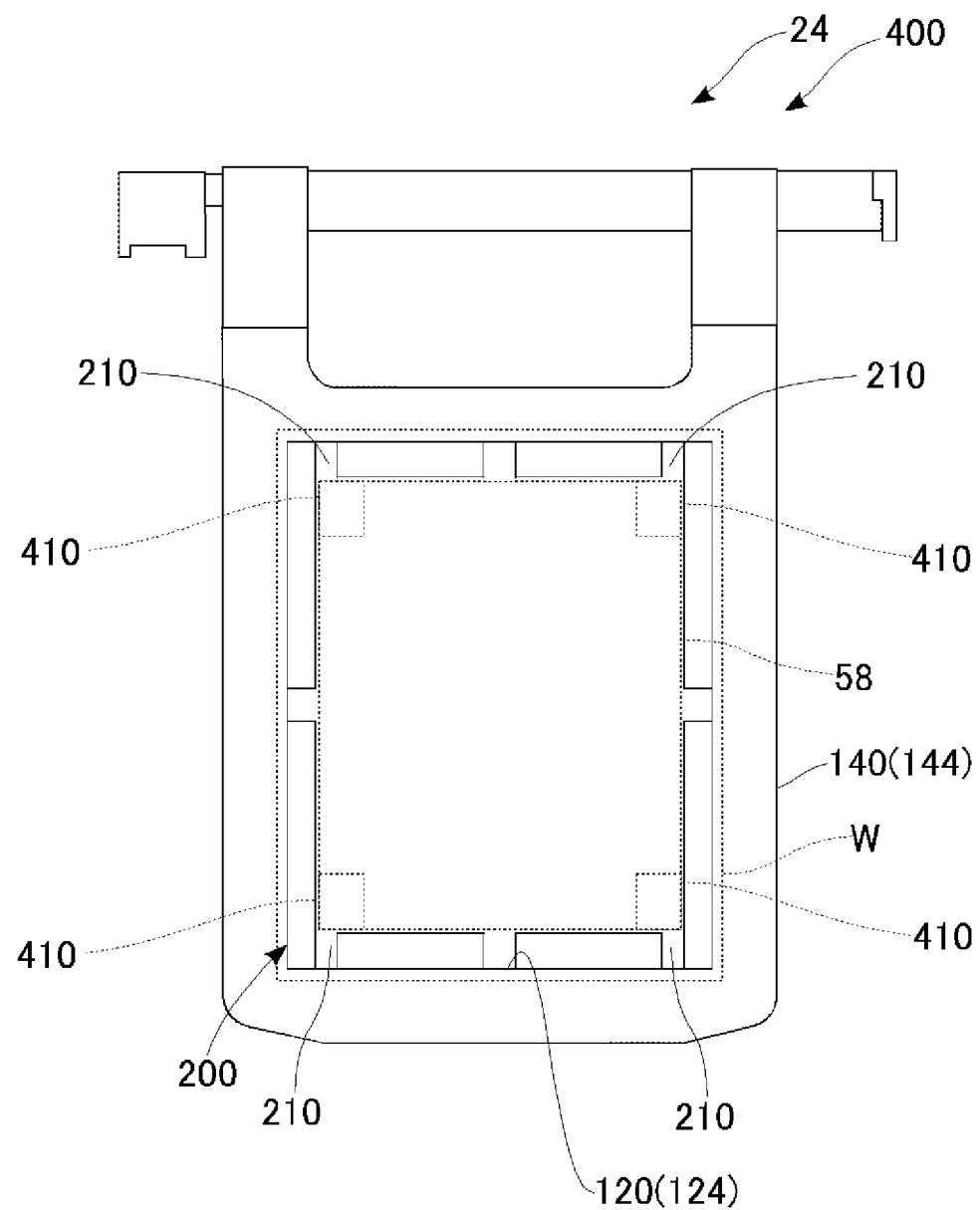
FIG. 14 is a conceptual view showing a state in which the regulation plate and the substrate holder are overlapped.

FIG. 14 is a conceptual view showing a state in which the regulation plate 400 and the substrate holder 24 are overlapped. The substrate holder 24 is shown by a solid line, and the regulation plate 400 is shown by a dotted line. In addition, the liquid drain holes 212 (see FIG. 10) are omitted from the substrate holder 24 from the viewpoint of visibility.

As described with reference to FIG. 9, in the first embodiment, the mask body 90 and the holder mask 200 suppress the increase in the film thickness at the peripheral part of the substrate W caused by the terminal effect. In addition, depending on the types of the substrates W and the like, in some cases, the mask body 90 alone may have an insufficient electric field shielding function in the region slightly inward of the peripheral part (in the vicinity of the corners) at the corners of the substrate W. In this case, the film thickness in the vicinity of the corners of the substrate W becomes large. Also, when the gaps 210 are provided as in the holder mask 200 in the first embodiment, while optimization of the film thickness is realized at the corners of the substrate W, there is a concern that the film thickness in the vicinity of the corners may become large. In either case, the in-plane uniformity of the substrate W decreases. In this embodiment, the corner masks 410 shield the electric field in the vicinity of the peripheral part at the corners of the substrate W. In this way, an appropriate film thickness may be obtained in the vicinity of the corners of the substrate W. Therefore, the in-plane uniformity of the substrate W may be improved.

The exemplary embodiments of the disclosure have been described above, but it goes without saying that the disclosure is not limited to the specific embodiments, and various modifications may be made within the scope of the technical idea of the disclosure.

In the above embodiments, the aspect in which one surface of the anode is exposed has been described. In a modified example, a frame-shaped anode mask made of a dielectric material may be provided along the opening of the anode holder. Specifically, the anode mask may be provided on the surface of the anode holder facing the substrate holder to cover the outer peripheral part of the anode. By providing the anode mask, the film thickness distribution over the entire surfaces of the substrate may be adjusted. Further, the anode holder and the anode mask may be integrally formed. The opening of the holder body and the opening of the anode mask may be collectively referred to as "the opening of the anode holder."

In the above embodiments, a rectangular substrate having a side length of about 500 mm is adopted as the substrate, but the size, thickness, and shape of the substrate are not limited to this.

In the above embodiments, the holder mask 200 (shielding part) has a frame shape, and the gaps 210 are provided. This shape may also be understood as that a plurality of plate-shaped holder masks are disposed in the first opening and the second opening (opening) of the substrate holder, and the plurality of holder masks are collectively referred to as "the shielding part." This configuration may reduce the size of each holder mask. Further, in a modified example, the shape of the gap may be another shape such as a rhombic shape in a front view including a corner of the frame-shaped holder mask. That is, a frame-shaped holder mask (shielding part) may be provided on the substrate holder along the peripheral part of the substrate, and a discontinuous part having no shielding function may exist at the corners thereof.

In the above embodiments, the holder mask 200 has the gaps 210 that are discontinuous in the entire width direction of the frame shape. In a modified example, the holder mask (shielding part) may be provided with a discontinuous part having no shielding function in a part of the width direction. That is, in the example shown in FIG. 10, the holder mask 200 is not provided at the positions of the gaps 210. In a modified example, a shielding part having a shielding width smaller than that of the holder mask may be provided at the positions of the gaps. The frame-shaped shielding part may have a predetermined shielding width at the peripheral part of the substrate, and may have, at the corner part thereof, a discontinuous part having a shielding width smaller than the shielding part adjacent to the corner part. In other words, the frame-shaped shielding part may have a predetermined shielding width at the peripheral part of the substrate, and may have, at the corner part thereof, a discontinuous part having a shielding width smaller than surroundings of (in the vicinity of) the corner part. It may be said that the discontinuous part is a part that is provided at the corner part of the shielding part and has a locally small shielding width.

In the above embodiments, the height h1 from the surface of the substrate W to the upper end surface of the first holding member 122 and the height h2 from the surface of the substrate W to the upper end surface of the holder mask 200 are set to be equal. In a modified example, the height h1 may be greater than the height h2, or the height h1 may be less than the height h2.

In the above embodiments, an aspect in which the holder mask is attached to the substrate holder has been described. In a modified example, the substrate holder and the holder mask (shielding part) may be integrally formed. In this case as well, the opening of the substrate holder defines the region where the electric field is formed.

In the above embodiments, the liquid drain holes and the gaps are described as separate bodies. In a modified example, the liquid drain holes are not necessarily provided, and the gaps may be used as a flow passage for discharging the plating solution. Further, the liquid drain holes may be provided symmetrically or asymmetrically on opposite sides of the frame-shaped holder mask. Further, the direction of the opening of the liquid drain holes may be parallel to the surface of the substrate. The liquid drain holes may also be used as the gaps for adjusting the electric field, and the number and disposition location thereof may be appropriately set.

In the above embodiments, an aspect in which the two surfaces of the substrate are plated has been described. In a modified example, plating may be performed to one surface of the substrate. In this case, the anode may be provided at a position facing the plating surface of the substrate, and is not necessarily provided at a position facing the surface of the substrate opposite to the surface to be plated. Further, the holder mask may be provided only on the surface of the substrate holder that faces the anode and is not necessarily provided on the opposite surface.

In the above embodiments, the first holding member and the second holding member are made of metal, and the holder mask is made of resin or the like. The materials of the substrate holder and the holder mask are not limited to the above, and various materials may be selected; for example, the holder mask may be made of metal. Further, the substrate holder and the holder mask may be made of the same material.

In the second embodiment, the corner mask has a rectangular shape. The shape of the corner mask is not limited to the above, and various shapes such as a fan shape and a triangular shape may be adopted. In any of the cases, the in-plane uniformity of the substrate may be improved by appropriately shielding the electric field in the vicinity of the corners of the substrate.

It should be noted that the disclosure is not limited to the above-described embodiments and modified examples, and the configuring elements may be modified and embodied without departing from the scope of the disclosure. Various inventions may be formed by appropriately combining a plurality of configuring elements disclosed in the above-described embodiments and modified examples. In addition, some configuring elements may be deleted from all the configuring elements shown in the above-described embodiments and modified examples.

What is claimed is:

1. A substrate holder for holding a substrate in a rectangular shape and performing electrolytic plating on the substrate, the substrate holder comprising:
   a first holding member; and
   a second holding member having a contact which contacts a peripheral part of the substrate and supplies an electric current to the substrate, wherein the substrate is clamped between the first holding member and the second holding member;
   wherein the second holding member comprises:
   an opening which defines a region where an electric field is formed; and
   at a position farther from the substrate than the opening, a shielding part which protrudes closer to an inner side than the opening and shields the peripheral part of a surface of the substrate,
   wherein the shielding part has a frame shape which has a predetermined shielding width in the peripheral part of the substrate, and
   wherein the shielding part has, at a corner part of the shielding part, a discontinuous part which has a smaller shielding width than surroundings.

2. The substrate holder according to claim 1, wherein the shielding part has a hole for draining liquid separately from the discontinuous part.

3. The substrate holder according to claim 1, further comprising an adjustment component for moving the shielding part along the inner side of the opening in a direction toward or away from the surface of the substrate.

4. The substrate holder according to claim 1, wherein the shielding part has a step part that gradually increases a distance from the surface of the substrate from the inner side of the opening.

5. The substrate holder according to claim 4, wherein the shielding part comprises:
- a first member having the step part; and
- a second member assembled to the first member for adjusting a shielding length to the inner side of the opening.

6. A plating device for performing a plating process on a substrate in a rectangular shape, the plating device comprising:
- a plating tank;
- an anode disposed in the plating tank;
- a substrate holder which holds the substrate and which is disposed in the plating tank to face the anode; and
- a regulation plate which is disposed between the anode and the substrate holder in the plating tank, has an opening in a rectangular shape for adjusting an electric field formed between the anode and the substrate, and has a corner mask protruding toward an inner side at a corner part of the opening, wherein the substrate holder comprises:
- a first holding member; and
- a second holding member having a contact which contacts a peripheral part of the substrate and supplies an electric current to the substrate, wherein the substrate is clamped between the first holding member and the second holding member;

wherein the second holding member comprises:
- an opening which defines a region where the electric field is formed; and
- at a position farther from the substrate than the opening, a shielding part which protrudes closer to the inner side than the opening and shields the peripheral part of a surface of the substrate, wherein the shielding part has a frame shape which has a predetermined shielding width in the peripheral part of the substrate, and wherein the shielding part has, at a corner part of the shielding part, a discontinuous part which has a smaller shielding width than surroundings.

* * * * *